United States Patent [19]
Kaneko et al.

[11] Patent Number: 5,592,421
[45] Date of Patent: Jan. 7, 1997

[54] SEMICONDUCTOR INTEGRATED CIRCUIT FOR GENERATING AN INTERNAL POWER SOURCE VOLTAGE WITH REDUCED POTENTIAL CHANGES

[75] Inventors: Tetsuya Kaneko, Kawasaki; Takashi Ohsawa, Yokohama, both of Japan

[73] Assignee: Kabushiki Kaisha Toshiba, Kawasaki, Japan

[21] Appl. No.: 393,077

[22] Filed: Feb. 23, 1995

[30] Foreign Application Priority Data

Feb. 25, 1994 [JP] Japan .................................. 6-028313

[51] Int. Cl.⁶ ..................................................... G11C 13/00
[52] U.S. Cl. ............................. 365/189.09; 365/189.11; 365/226
[58] Field of Search ...................... 365/189.09, 189.11, 365/226, 227; 327/530, 538

[56] References Cited

U.S. PATENT DOCUMENTS

| | | | |
|---|---|---|---|
| 5,329,168 | 7/1994 | Sugibayashi et al. | 365/189.09 |
| 5,363,333 | 11/1994 | Tsujimoto | 365/189.09 |
| 5,426,616 | 6/1995 | Kajigaya et al. | 365/226 |

FOREIGN PATENT DOCUMENTS

0470498A2  12/1992  European Pat. Off. .
0574002A3  12/1993  European Pat. Off. .

OTHER PUBLICATIONS

M. Horiguchi et al., "Dual-Operating-Voltage Scheme for a Single 5-V 16 Mbit DRAM", IEEE Journal of Solid-State Circuits, vol. 23, No. 5, Oct. 1988, pp. 1128-1132.

Primary Examiner—David C. Nelms
Assistant Examiner—Vu A. Le
Attorney, Agent, or Firm—Banner & Witcoff, Ltd.

[57] ABSTRACT

A semiconductor integrated circuit device is provided that can restrict changes in the internal power source potential when an externally applied power source potential changes. The semiconductor integrated circuit device comprises an integrated circuit section, a voltage regulator for limiting an externally applied potential which causes changes in potential levels to a certain potential level to obtain a regulated potential, and a boost circuit driven by the regulated potential as a power source, for boosting the regulated potential to a boosted potential used as a operating power source for the integrated circuit section. The boost circuit is driven by the regulated potential limited to a certain potential level. Even when the level of the potential VCC changes, operation of the boost circuit does not substantially change. Due to the structure in which the boosted potential is generated from the regulated potential, the constant potential range of the boosted potential is enlarged so that operating margins of the device are enlarged.

28 Claims, 11 Drawing Sheets

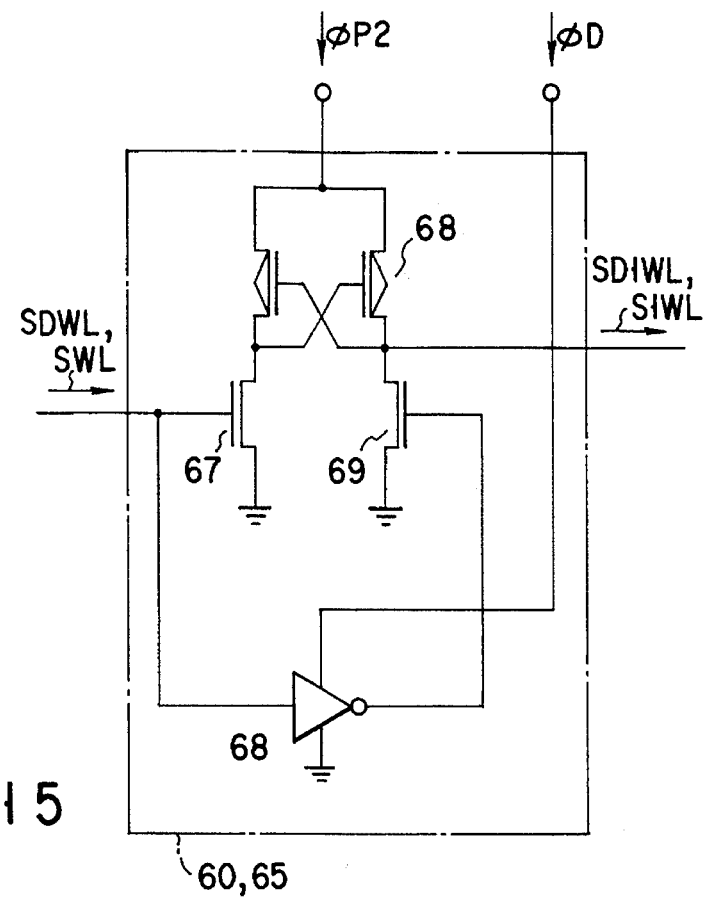
F I G. 15
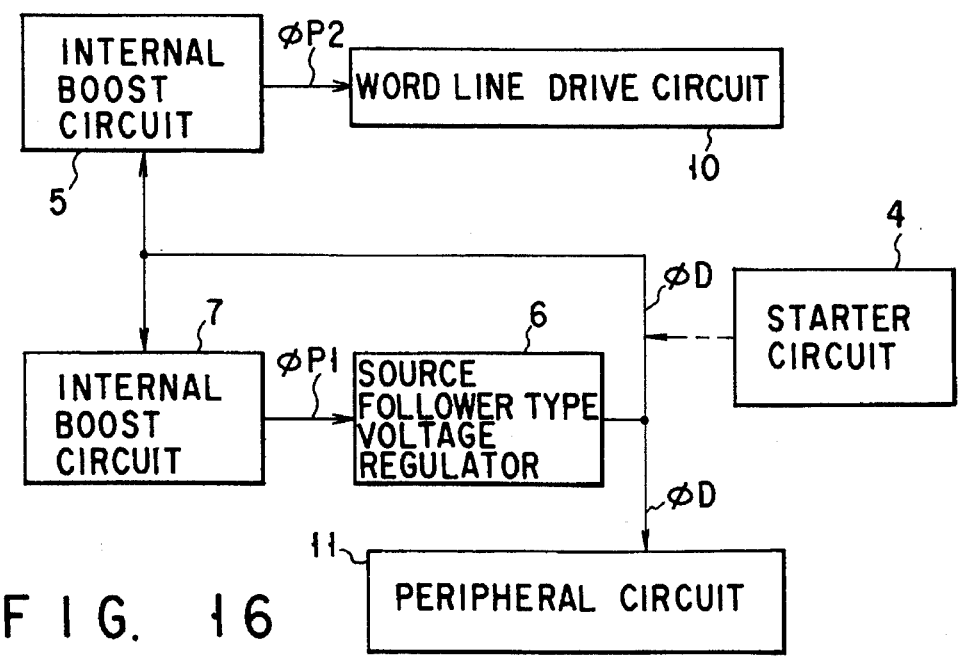
F I G. 16

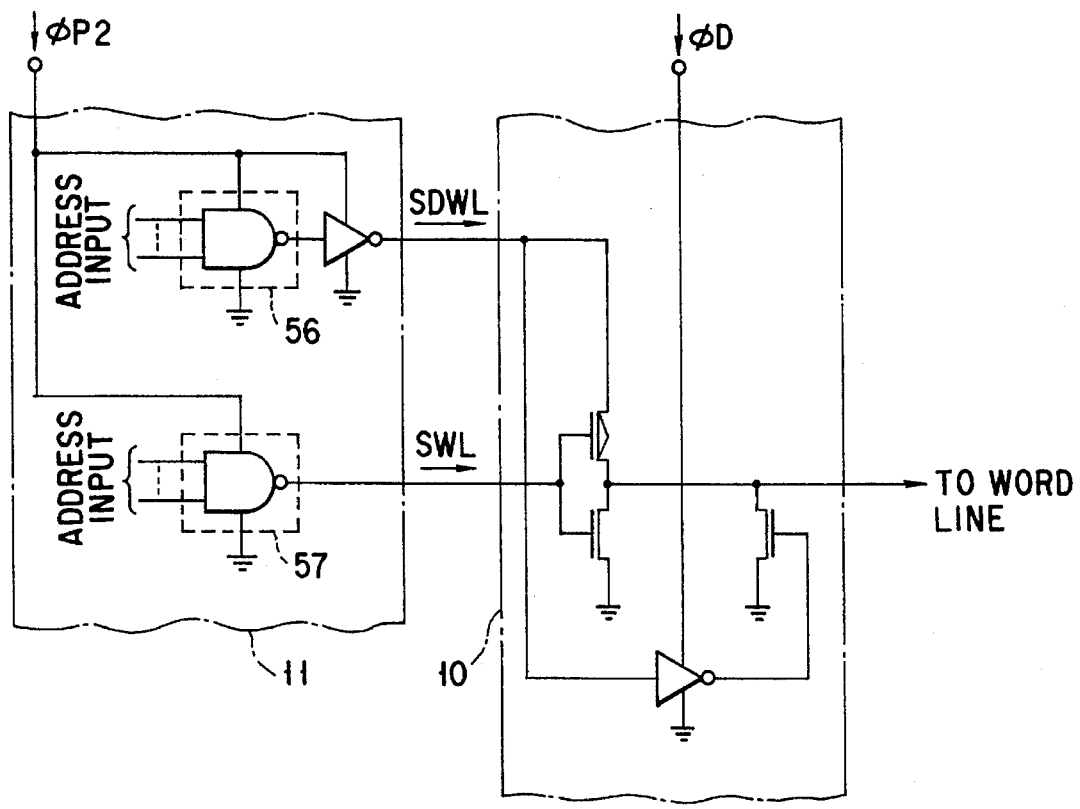
F I G. 21
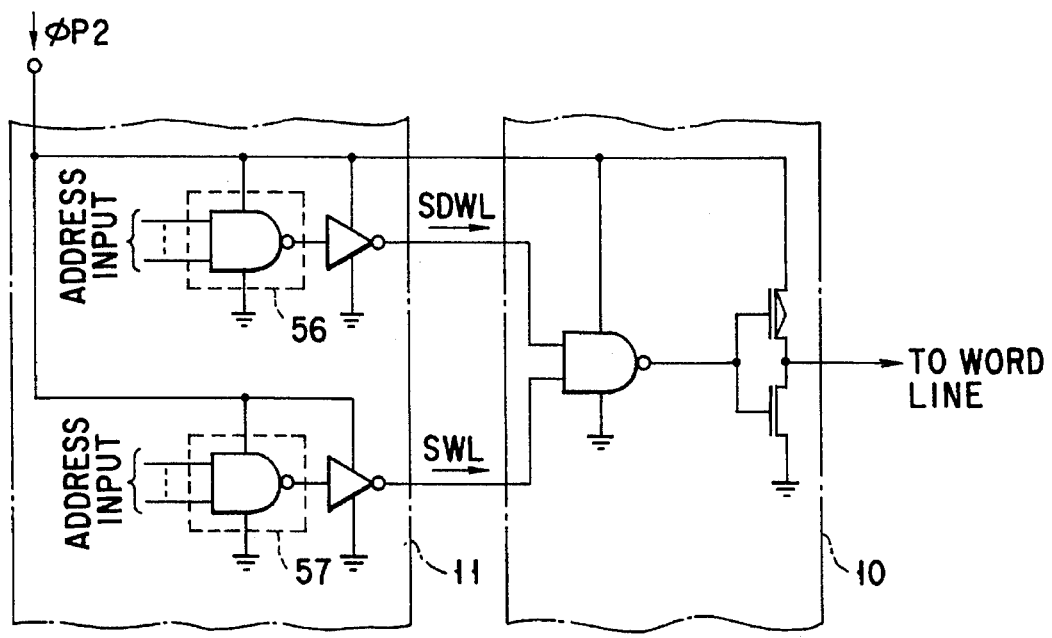
F I G. 22

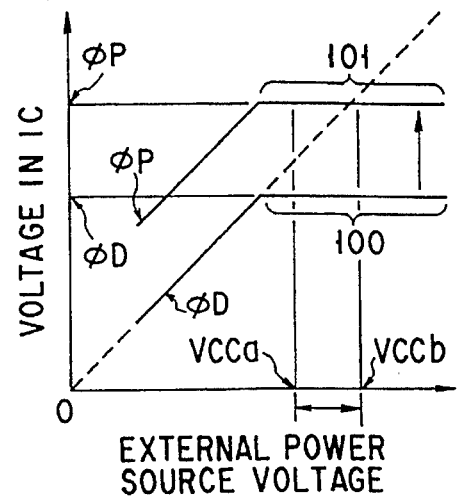
F I G. 24
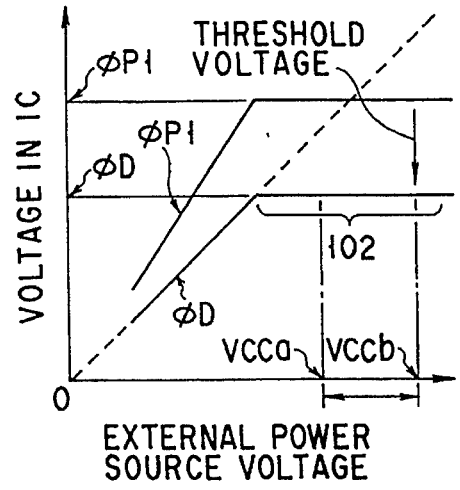
F I G. 26
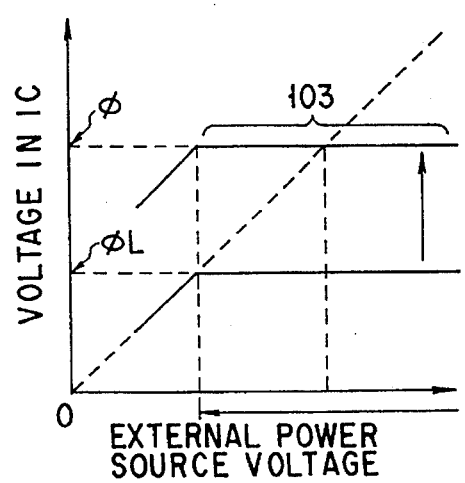
F I G. 28

5,592,421

SEMICONDUCTOR INTEGRATED CIRCUIT FOR GENERATING AN INTERNAL POWER SOURCE VOLTAGE WITH REDUCED POTENTIAL CHANGES

BACKGROUND OF THE INVENTION

1. Field of the Invention

The present invention relates to a semiconductor integrated circuit device, and particularly, to a semiconductor integrated circuit having an improved power source system in the integrated circuit.

2. Description of the Related Art

In a conventional dynamic random access memory (DRAM), it is rather desirable to make an integrated circuit itself generate a predetermined voltage, than to directly use an external power source voltage. This is because application of a single external power source needs to be connected to the integrated circuit even when a plurality of voltage levels are required in the integrated circuit.

A conventional DRAM adopts a method of using a single externally applied power source voltage and of generating any other necessary voltages in the integrated circuit. An internal voltage generator is, for example, a substrate potential generator supplying a substrate potential and a well potential, an internal power source voltage generator used as an internal power source, or a reference potential generator used as an internal reference potential.

A voltage generator used as an internal power source is, for example, a boost circuit, a voltage regulator, or the like. These internal voltage generators are used to improve operating margins of an integrated circuit and to ensure its reliability. Particularly, in recent years, an externally applied power source voltage has decreased, and a DRAM mounting boost circuit has been proposed.

FIGS. 1 to 4 are block diagrams respectively showing structural examples of conventional DRAMs. FIG. 1 shows an example where an internal power source voltage generator is not used and a boot strap circuit is used to drive word lines, while an externally applied power source voltage is directly used for peripheral circuits. This method has been adopted in a 1M-bit DRAM or a 4M-bit DRAM, for example.

FIG. 2 shows a method of using an output of an internal voltage regulator which generates a potential obtained by regulating an externally applied power source voltage VCC. This method has been adopted in a 16M-bit DRAM, for example.

Examples shown in FIGS. 3 and 4 do not adopt the boot strap method stated above, but adopt a method of using an output of an internal boosting circuit which generates a potential obtained by boosting an externally applied power source voltage VCC, as a power source for a word line drive circuit, in order to conform to application of an externally applied power source voltage VCC having a lowered voltage. In these examples, FIG. 3 shows a structure in which an externally applied power source voltage VCC is directly used as a power source for peripheral circuits, while FIG. 4 shows a structure using an internal voltage regulator as a power source for peripheral circuits. These methods have been designed and developed for use in a 64M-bit DRAM.

As explained above, conventional techniques teach use of a voltage regulator which generates a voltage lower than an externally applied power source voltage as a power source for peripheral circuits of a DRAM, or use of a boost circuit which generates a voltage higher than an externally applied power source voltage as a power source for word line drive circuits.

However, in a conventional internal power source voltage system, an internal boost circuit is driven by an externally applied power source voltage VCC, thereby boosting the voltage VCC to an internal boost potential φP as shown in FIG. 5. Likewise, an internal voltage regulator reduces an inputted potential VCC to an internal regulated potential φD. In this structure, when the potential level of the voltage VCC changes, the potential levels of the internal boost potential φP and the internal regulated potential φD are changed together.

In a DRAM of a generation which attained only low integration and a relatively low operating speed, changes in the potential levels as stated above fall within an allowable tolerance range. Once having taken into consideration 64M-bit, 256M-bit, and 1 G-bit DRAMs which will attain very large scale integration in the future, even slight changes in potential levels will be enough to cause erroneous operations.

The present invention has been made in view of the above situation, and has an object of providing a semiconductor integrated circuit device which is capable of restricting changes in internal power source potentials even when an externally applied power source potentials changes.

SUMMARY OF THE INVENTION

The object of the present invention will be achieved by the following structure.

A semiconductor integrated circuit device comprising:

an integrated circuit section;

convert means for converting a first potential which causes changes in potential levels into a second potential which attains a constant potential range where potential changes are reduced, by regulating the first potential at a predetermined potential level; and generating means driven by the second potential as a power source, for generating a third potential used as an operating power source for at least a part of circuits in the integrated circuit section.

Further, the above circuit device is characterized in that the convert means is a voltage regulator for restricting the first potential at a predetermined potential level, and that the generation means is driven by using the second potential as a power source and boosts the third potential, with the constant potential range of the second potential being reflected.

In the above structure, the generation means for generating a third potential used to operate at least integrated circuits is driven by a power source of the second potential which attains a constant potential range where potential changes are reduced, by restricting the externally applied first potential at a certain potential level. Thus, since the generation means uses the second potential as an operating power source, the operating conditions of the generation means are not less changed or influenced even when the externally applied first potential changes. As a result, a third potential whose potential changes are reduced can be constantly generated by the generation means.

Further, since the convert means is a voltage regulator and since the generation means is a boost circuit which boosts the second potential to the third potential with the constant potential range of the second potential being reflected, the above object can be achieved. Therefore, a larger constant potential range in the third potential can be obtained than in a device in which a constant potential range is obtained by merely restricting a first potential to a certain potential. As a result, operating margins of the device are enhanced so that erroneous operations are not easily caused. A charge-pump circuit is a boost circuit capable of boosting voltages as in the manner stated above.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 15 is a circuit diagram of a level shifter shown in FIG. 14;

FIG. 16 is a block diagram schematically showing a main part of a dynamic type RAM shown in FIG. 6;

FIG. 21 is a second circuit diagram showing another example of the word line drive circuit;

FIG. 22 is a third circuit diagram showing another example of the word line drive circuit;

FIG. 24 is a graph showing the characteristic of an internal boosted voltage in a device according to the present invention;

FIG. 26 is a graph showing the characteristic of an internal regulated voltage in a device according to the present invention;

FIG. 28 is a graph showing the characteristic of an internal power source voltage in a device according to the present invention.

DETAILED DESCRIPTION OF THE PREFERRED EMBODIMENTS

In the following, the present invention will be explained with reference to embodiments. To explain the embodiment, the same components are denoted by the same reference symbols in all the drawings, and duplicative explanation of the same components will be omitted.

Figure 1:
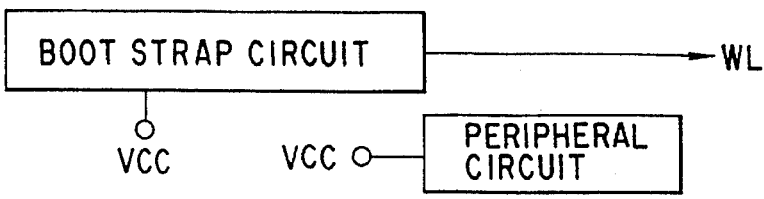
FIGS. 1 to 4 are block diagrams showing examples of conventional internal power source voltage systems used in DRAMs.
Figure 2:
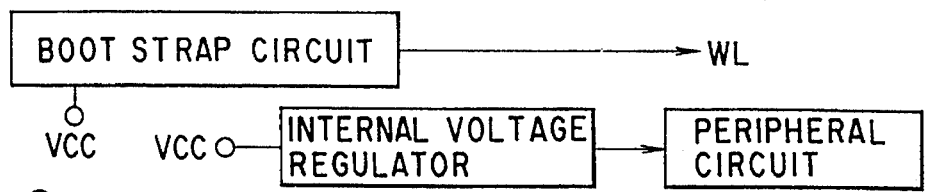
Figure 3:
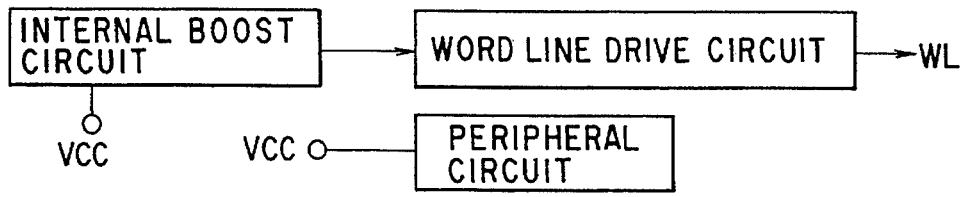
Figure 4:
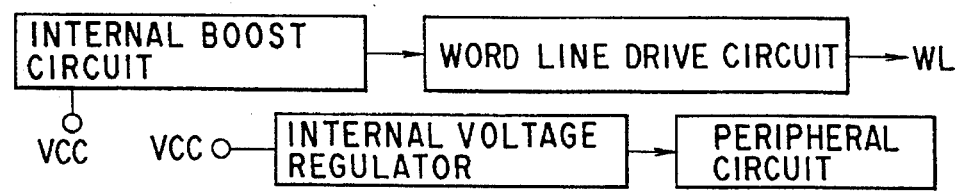
Figure 5:
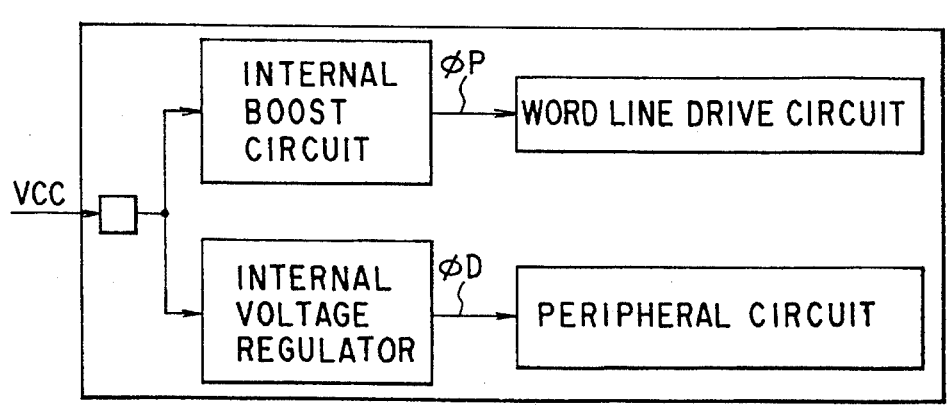
FIG. 5 is a block diagram for explaining problems of a conventional internal power source voltage system.
Figure 6:
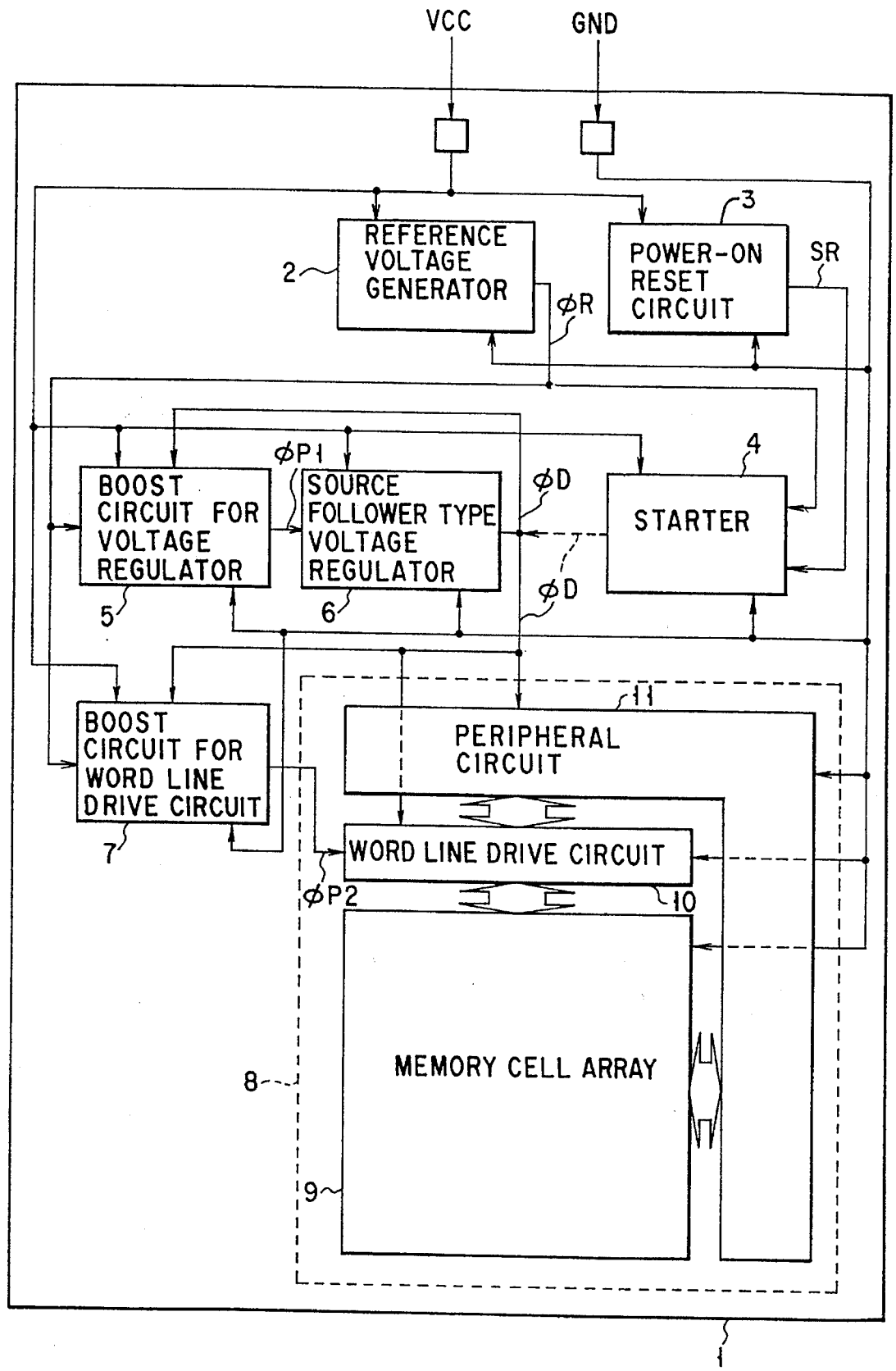
FIG. 6 is a block diagram of a dynamic type RAM according to the first embodiment of the present invention.

FIG. 6 is a block diagram showing a dynamic type RAM according to the first embodiment of the present invention. As shown in FIG. 6, an IC chip 1 is internally provided with: a reference voltage generator 2 for generating a reference voltage $\phi R$ from an externally applied potential VCC; a power-on reset circuit 3 for outputting a reset signal SR after a predetermined time period from turning-on of the externally applied voltage VCC (i.e., an external power source); a starter 4 for outputting an internal regulated potential $\phi D$ responsive to the reference voltage $\phi R$ until the reset signal SR falls; a boost circuit 5 for a voltage regulator which is driven by a potential difference between the regulated potential $\phi D$ and a ground potential GND and boosts the regulated potential $\phi D$ to a boosted potential $\phi P1$ for a voltage regulator; a source follower type voltage regulator 6 which is controlled by the boosted potential $\phi P1$ and regulates the applied potential VCC to the internal regulated potential $\phi D$; a boost circuit 7 for a word line drive circuit section which is driven by a potential difference between the regulated potential $\phi D$ and the ground potential GND and boosts the regulated potential $\phi D$ to a boosted potential $\phi P2$ for the word line drive circuit section; and an integrated circuit section 8 including circuits which are respectively driven by a potential difference between the regulated potential $\phi D$ and the ground potential GND and by a potential difference between the boost potential $\phi P2$ and the ground potential GND. The device according to the first embodiment is a dynamic type RAM, and the integrated circuit section 8 is provided with main circuits, such as a memory cell array 9, a word line drive circuit 10, and a peripheral circuit 11.

Next, operations of FIG. 6 will be explained in the following.

After turning on the external power, the reference voltage generator 2 generates a reference voltage $\phi R$, and substantially at the same time, the power-on reset circuit 3 outputs a reset signal SR of a level "H". The reset signal SR of the level "H" is inputted into a starter 4, and the reference voltage $\phi R$ is inputted into the starter and the boost circuits 5 and 7. The starter 4 is activated by receiving inputs of the reference voltage φR and the reset signal SR of the level "H", and keeps outputting a regulated potential φD while the reset signal SR maintains the level "H". The regulated potential φD is supplied as a high potential power source to the boost circuits 5 and 7 and the integrated circuit section 8 (including the word line drive circuit 10 and the peripheral circuit 11). The boost circuits 5 and 7 are applied with an operating power source by supply of the regulated potential φD, and thereby output boosted potentials φP1 and φP2, respectively. The boosted potential φP1 is inputted into the source follower type voltage regulator 6, and the boosted potential φP2 is supplied as a high potential power source to the integrated circuit section 8 (to the word line drive circuit 10). The voltage regulator 6 is maintained conductive while the boosted potential φP1 is at the level "H", and the circuit 6 regulates the applied voltage VCC to the regulated potential φD, thereby continuing to output the regulated potential φD. In this stage, the power-on reset circuit 3 makes the reset signal SR fall from the level "H" to a level "L" at the timing with which the voltage regulator 6 outputs the regulated potential φD after the power is turned on. The starter 4 is cut off upon receipt of a reset signal SR of level "L", and thereafter, the regulated potential φD is outputted from the voltage regulator 6.

Next, the structure of the boost circuits 5 and 7 will be explained.

The boost circuits 5 and 7 have a common structure which will be explained with reference to FIG. 7. The boost circuits 5 and 7 have the following structure. Specifically, the boost circuit comprises: a voltage control circuit 12 for controlling a boosted potential φP which are outputs of the boost circuits 5 and 7 at a set potential; an oscillation circuit 13 which uses a potential difference between the regulated potential φD and the ground potential as an operating power source and which is controlled by control signals S0 and BS0 (where B represents an reversal signal) from the voltage control circuit 12, to output a clock signal CLK for driving a capacitor in a charge pump circuit 15; a buffer circuit 14 which uses a potential difference between the regulated potential φD and the ground potential as an operating power source, to convert the clock signal CLK into a clock signal CLK0 suitable for driving the capacitor in the charge pump circuit 15; the charge pump circuit 15 which uses a potential difference between the regulated potential φD and the ground potential as an operating power source and which is controlled by the clock signal CLK0, to boost the regulated potential φD to a boosted potential φP and output the boosted potential; and a feed back circuit 16 for feeding back the boosted potential φP to the voltage control circuit 12.

Next, operation of the boost circuits stated above will be explained with reference to circuit configurations of each block of the boost circuits. FIG. 8 is a circuit diagram of the voltage control circuit 12 shown in FIG. 7. The voltage control circuit 12 consists mainly of a voltage generator section 17 and a control signal generator section 18. After an external power source is turned on, a reference potential φR is inputted into a gate of an N-channel type MOS FET (which will be referred to as an NMOS hereinafter) of the voltage generator section 17. The NMOS 19 is thereby turned on, and a drain of the NMOS 19 has a low potential. From the drain of the NMOS 19, an internal voltage signal SC of a level "L" is extracted from the drain of the NMOS 19, and a signal SC of level "L" is supplied to an input of the inverter 20 of the control signal generator section 18. The inverter 20 is driven by a potential difference between a regulated potential φD and the ground potential. When the regulated potential φD is supplied to a power source terminal of the inverter 20, this inverter outputs a control signal SO of level "H". In addition, the signal SO is also supplied to an input of an inverter 21. The inverter 21 is driven by a potential difference between the regulated potential φD and the ground potential, in the same way. The inverter 21 outputs a control signal BSO of a level "L".

Although explanation to the specific circuit configuration of the reference voltage generator 2 will be omitted herefrom, the reference voltage generator 2 generally has only a low dependency on an external applied source voltage.

Figure 7:
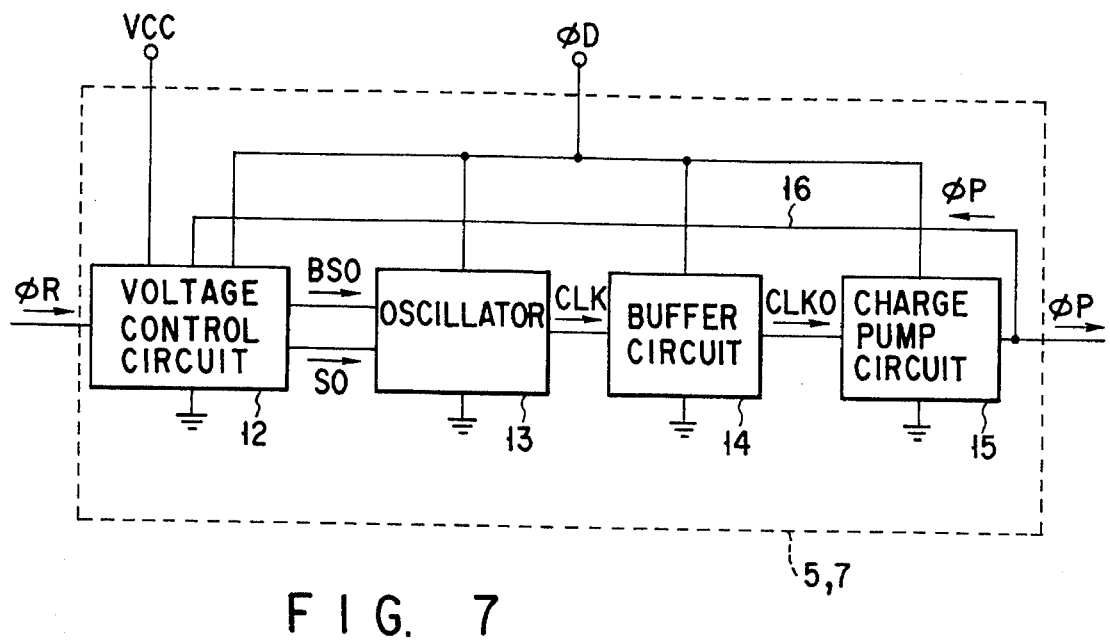
FIG. 7 is a block diagram of the boost circuit shown in FIG. 6.
Figure 8:
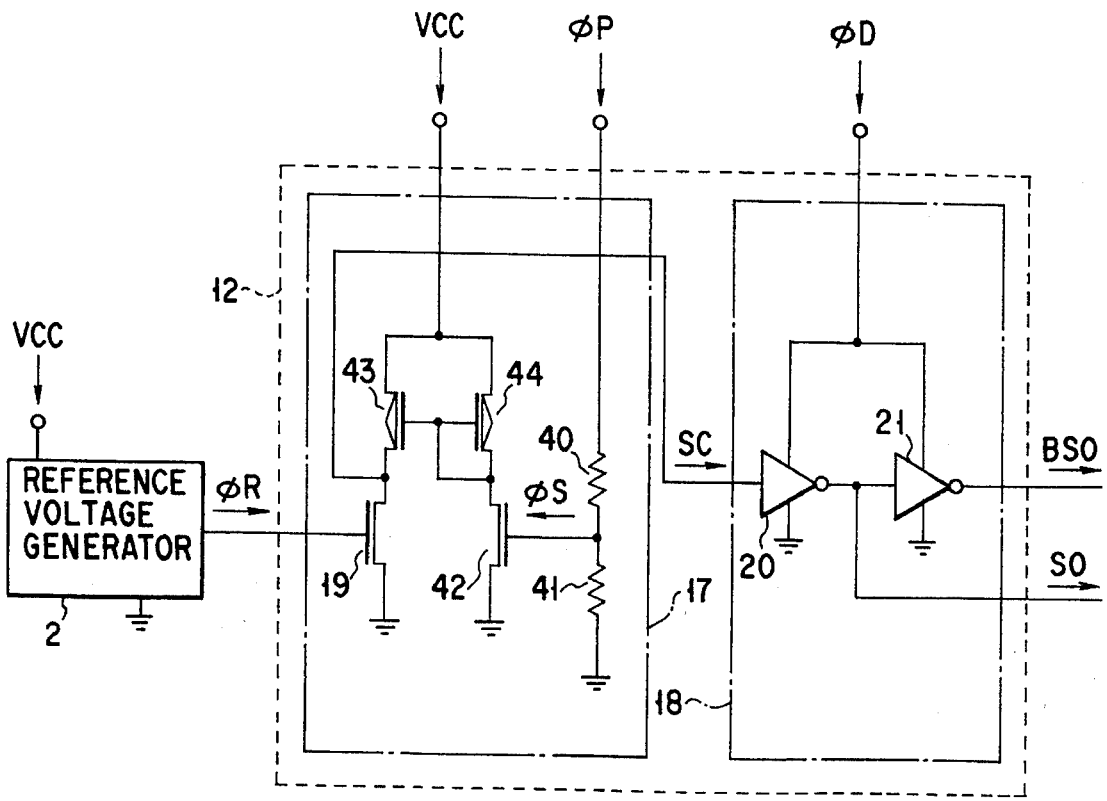
FIG. 8 is a circuit diagram of a voltage control circuit shown in FIG. 7.
Figure 9:
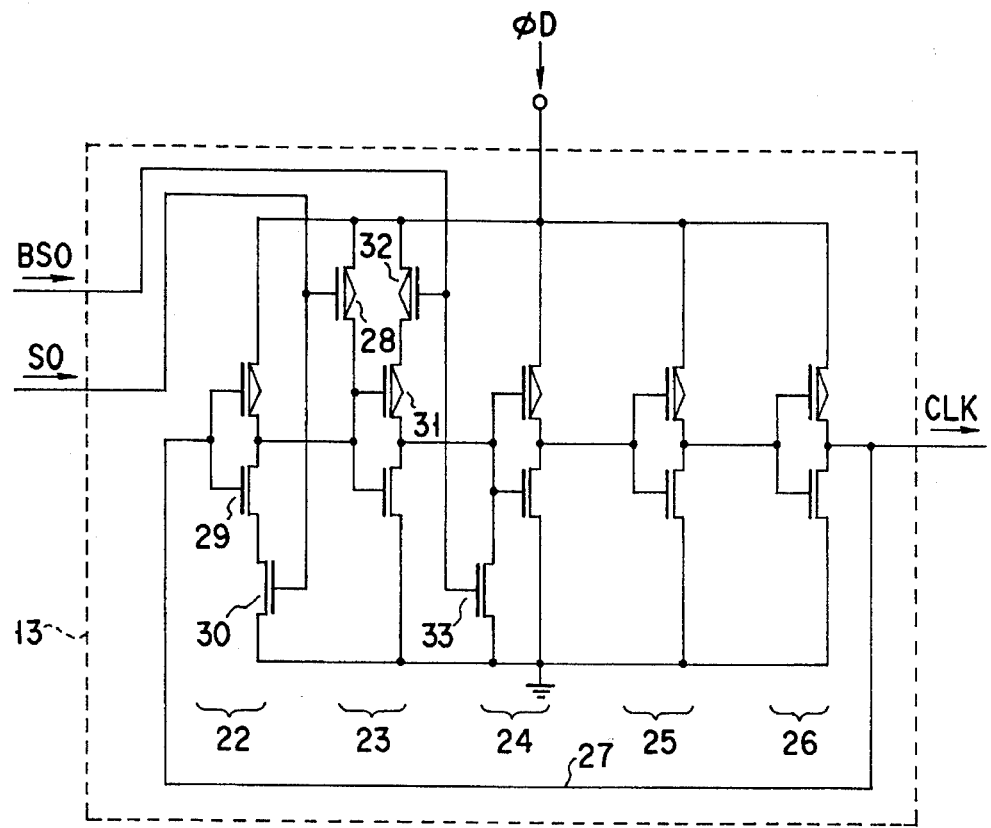
FIG. 9 is a circuit diagram of an oscillation circuit shown in FIG. 7.

FIG. 9 is a circuit diagram of the oscillation circuit 13 shown in FIG. 7. The oscillation circuit 13 is a ring oscillator consisting of CMOS inverters 22 to 26 arranged in five stages and connected in series with each other, and a feed back circuit 27 for feeding back an output of the inverter 26 of the final stage to the inverter 22 in the first stage. Each of these CMOS inverters of five stages is driven by a potential difference between a regulated potential and a ground potential.

A control signal SO is inputted into a gate of a P-channel type MOS FET 28 (which will be referred to as a PMOS hereinafter) whose source is connected to a power source terminal supplied with a regulated potential φD and whose drain is connected to an input of the inverter 23 in the second stage. Simultaneously, the control signal SO is also inputted into a gate of an NMOS 30 whose source is connected to a ground terminal and whose drain is connected to a source of an NMOS 29 of the inverter 22 in the first stage. A control signal BSO is inputted into a gate of a PMOS 32 whose source is connected to a power source terminal supplied with a regulated potential φD and whose drain is connected to a source of the PMOS 31 of the inverter 23 in the second stage. Simultaneously, the control signal BSO is also inputted into a gate of an NMOS 33 whose source is connected to a ground terminal and whose drain is connected to an input of the inverter 24 in the third stage.

In this stage, if the control signal SO is of a level "H" and the control signal BSO is of a level "L", the PMOS 28 and NMOS 33 are turned off and the NMOS 30 and the PMOS 32 are turned on, so that an operating power source is supplied to each of the CMOS inverters 22 to 26 of five stages. As a result, the oscillation circuit 13 is activated and oscillates a predetermined clock signal CLK.

Figure 10:
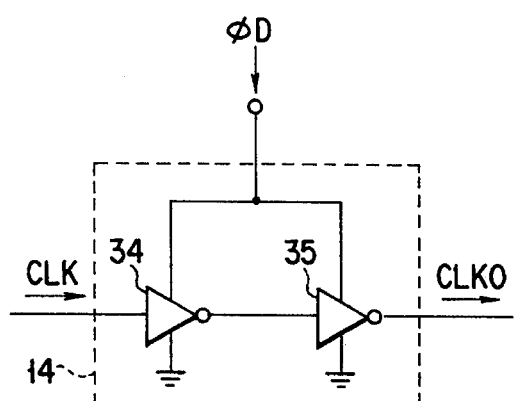
FIG. 10 is a circuit diagram of a buffer circuit shown in FIG. 7.

FIG. 10 is a circuit diagram of the buffer circuit 14 shown in FIG. 7. The buffer circuit 14 consists of inverters 34 and 35 arranged in two stages and connected in series with each other. These inverters 34 and 35 of two stages are each driven by a potential difference between a regulated potential φD and a ground potential. A clock signal CLK is supplied to an input of the inverter 34 and is converted into a clock signal CLK0 suitable for driving a charge pump circuit 15. Then, the signal CLK0 is outputted from the inverter 35.

Figure 11:
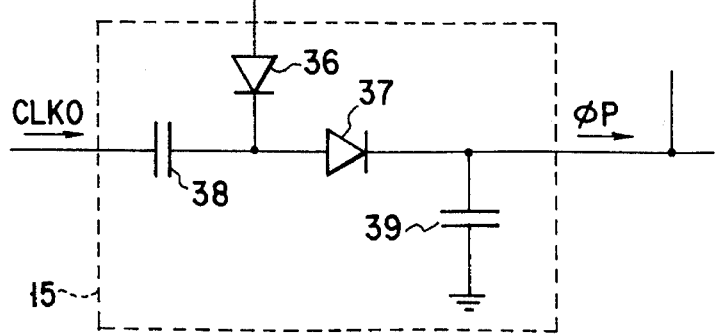
FIG. 11 is a circuit diagram of a charge pump circuit shown in FIG. 7.

FIG. 11 is a circuit diagram of the charge pump circuit 15 shown in FIG. 7. The charge pump circuit 15 comprises two diodes 36 and 37, a capacitor 38, and a capacitor 39. The diodes 36 and 37 are connected in series with each other in their forward direction, between a power source terminal supplied with a regulated potential φD and an output terminal for generating and outputting a boosted potential φP. The capacitor 38 has an electrode connected between the cathode of the diode 36 and the anode of the diode 37 and another electrode connected to an input terminal supplied with a clock signal CLK0. The capacitor 39 has an electrode connected to the cathode of the diode 37 and another electrode connected to a ground potential.

When a clock signal CLK0 is inputted into the latter electrode of the capacitor 38, the output node of the diode 37 has a potential higher than the regulated potential φD, thereby generating a boosted potential φP. This boosted potential φP is fed back to the voltage generator section 17 of the voltage control circuit 12 shown in FIG. 8.

As shown in FIG. 8, the voltage generator section 17 is provided with resistors 40 and 41 which are connected in series between a power source terminal supplied with a boosted potential φ and a ground terminal. A mutual connection point between the resistors 40 and 41 is connected to a gate of an NMOS 42 having a grounded source. The boosted potential φP is voltage-converted into a converted potential φS by means of resistance separation due to the resistors 40 and 41. The converted potential φS is compared with a reference potential φR. The NMOS 42 is turned off when the boosted potential φP is lower than a set potential, and is turned on when the boosted potential is higher than the set potential.

When the NMOS 42 is turned off, the voltage generator section 17 outputs an internal voltage signal SC of a level "L", so that operation as stated above is carried out, clock signals CLK and CLK0 are thereby generated, and the charge pump circuit 15 keeps boosting the regulated potential φD. On the contrary, when the NMOS 42 is turned on, the NMOS 42 turns on PMOSs 43 and 44. The PMOS 43 has a source connected to a power source terminal supplied with an applied potential VCC and a drain connected to the drain of an NMOS 19, while the NMOS 42 has a source connected to a power source terminal supplied with an applied potential VCC and a drain connected to the drain of the NMOS 42. As a result, the internal voltage signal SC goes to a level "H", the control signal SO goes to a level "L", and the control signal BSO goes to a level "H". Since the control signals SO and BSO thus have levels "L" and "H", the NMOS 30 and the PMOS 32 of the oscillation circuit 13 shown in FIG. 9 are turned off, while the PMOS 28 and the NMOS 33 are turned on. Therefore, the inverters 22 and 23 in the first and second stages are not supplied with an operating power source any more, and are thereby deactivated. In addition, while the control signal BSO has a level "H", a signal of level "L" is inputted into the input of the inverter 24 in the third stage, so that the inverter 24 keeps outputting a signal of level "H". As a result, a clock signal CLK is not generated any more, but is fixed at the level "H". Consequently, the charge pump circuit 15 does not boost the regulated potential φD.

As has been explained above, the boost circuits 5 and 7 shown in FIG. 6 have the same structure, the boosted potential φP1 for driving a voltage regulator and the boosted potential φP2 for a word line drive circuit can be set to different values. In this case, for example, the sizes and impedances of transistors of the buffer circuit 14 as well as the coupling rate of capacitors of the charge pump circuit 15 may be adjusted so that optimal boosted potentials can be obtained.

Next, the structure of a source follower type voltage regulator 6 will be explained.

Figure 12:
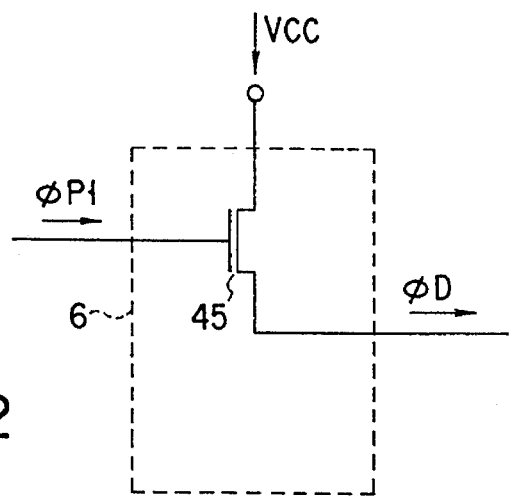
FIG. 12 is a circuit diagram of a source follower type voltage regulator shown in FIG. 6.

FIG. 12 is a circuit diagram of the source follower type voltage regulator 6 shown in FIG. 6. The voltage regulator consists of an NMOS 45 which has a drain connected to a power source terminal supplied with an applied potential VCC and a source for outputting a regulated potential φD, and which serves as a driver for a source follower type voltage regulator. The gate of the NMOS 45 is supplied with a boosted potential φP1 from a boost circuit 5. The source follower type voltage regulator 6 generates an internal regulated potential φD with use of a drop in the threshold voltage of the NMOS 45. The voltage regulator 6 outputs the regulated potential φD, but does not operate when the power source is turned on. Therefore, a starter 4 is added to the voltage regulator 6. Upon turning on the power source, the starter 4 generates a regulated potential φD for a period from the turning on of the power source until the voltage regulator 6 starts operating.

Figure 13:
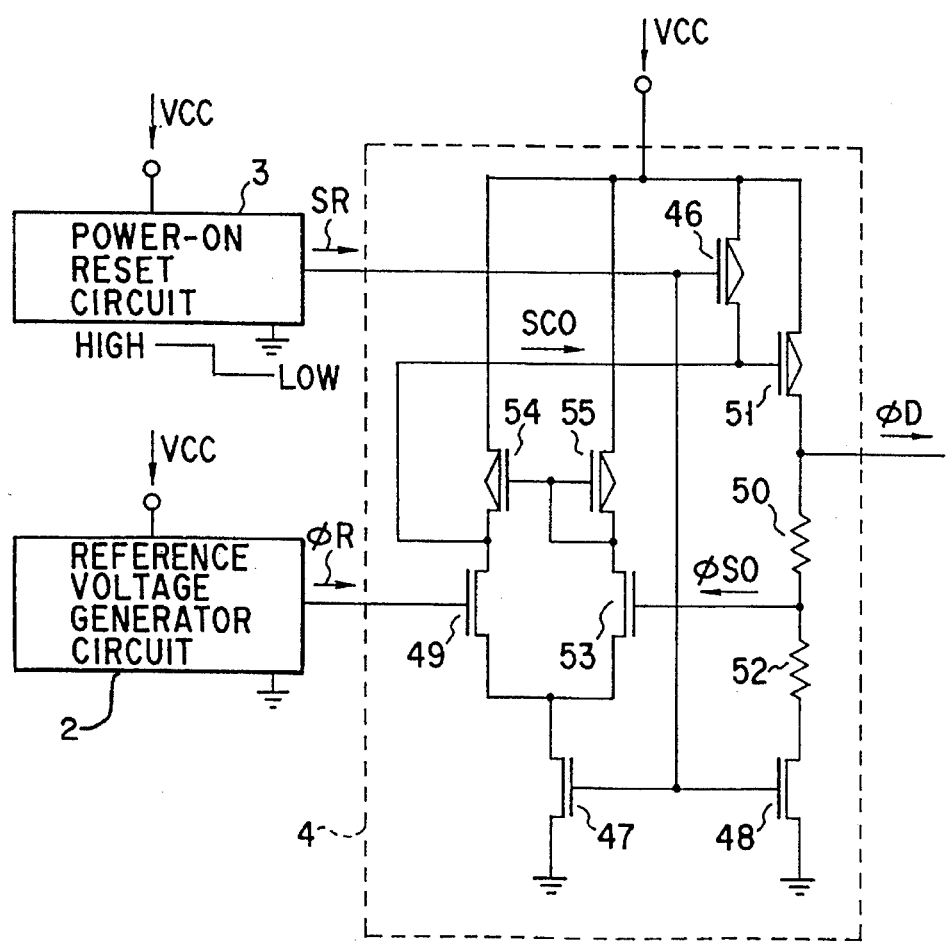
FIG. 13 is a circuit diagram of a starter shown in FIG. 6.

FIG. 13 is a circuit diagram of the starter 4 shown in FIG. 6. The starter 4 generates a regulated potential φD upon turning on an external power source before the source follower type voltage regulator 6 starts operating, and has a basic structure equivalent to a feed back type voltage regulator. After an external power source is turned on, a power-on reset circuit 3 outputs a reset signal SR of a level "H". The reset signal SR of level "H" is supplied to a gate of a PMOS 46 whose source is connected to a power source terminal supplied with an applied potential VCC, and to gates of NMOSs 47 and 48 whose sources are connected to a grounded terminal. Therefore, after an external power source is turned on, the PMOS 46 is turned off while the NMOS 47 and 48 are turned on.

Further, a reference potential φR is inputted into the gate of an NMOS 49 from a reference voltage generator 2. The source of the NMOS 49 is connected to the drain of the NMOS 47. Therefore, when the NMOS 49 is turned on, the drain of the NMOS 49 goes to a low potential. From the drain of the NMOS 49, an internal voltage signal SC0 of a level "L" is extracted. The signal SC0 of level "L" is supplied to a gate of a PMOS 51 whose source is connected to a power source terminal supplied with an applied voltage VCC and whose drain is connected to an end of a resistor 50. A resistor 52 is connected between another end of the resistor 50 and the drain of the NMOS 48. The PMOS 51 is turned on when an internal voltage signal SC0 of level "L" is inputted into the gate thereof. Therefore, a regulated potential φD is outputted from a mutual connection point between the drain of the PMOS 51 and the resistor 50. Further, the mutual connection point between the resistors 50 and 52 is connected to the gate of an NMOS 53 whose source is connected to the drain of the NMOS 47.

The regulated potential φD is voltage-converted to a converted potential φS0 by means of resistance separation using the resistors 50 and 52. In this stage, the converted potential φS0 is compared with the reference potential φR. Specifically, the NMOS 53 is turned off when the regulated potential φD is lower than a set voltage. As a result, an internal voltage signal SC0 of a level "L" continues to be outputted from the drain of the NMOS 49, thereby decreasing the impedance of the PMOS 51 and increasing the regulated potential φD to the set voltage. On the contrary, when the regulated potential φD is increased to be higher than the set voltage, the NMOS 53 is turned on. Since the drain of the NMOS 53 and the gates of the NMOS 54 and 55 are commonly connected, the PMOS 54 whose source is connected to a VCC power source terminal and whose drain is connected to the drain of the NMOS 49 as well as the PMOS 55 whose source is connected to a VCC power source terminal and whose drain is connected to the drain of the NMOS 53 are turned on. Therefore, the internal voltage signal SC0 goes to a level "H", thereby increasing the impedance of the PMOS 51 and decreasing the regulated potential φD to the set voltage.

The power-on reset circuit 3 outputs a level "H" when an external power source is turned on, and further generates a reset signal SR of level "L" after a predetermined time has passed, i.e., at the time point when the voltage regulator 6 shown in FIG. 6 starts outputting a regulated potential φD. When the reset signal SR goes to a level "L", the PMOS 46 is turned on, thereby setting the gate of the PMOS 51 at a high potential and turning off the PMOS 51 as well as the NMOS 47 and 48. Therefore, the starter 4 is not supplied with an operating power source any more, and stops operating.

Next, the structure of the integrated circuit section 8 shown in FIG. 6 will be explained.

Figure 14:
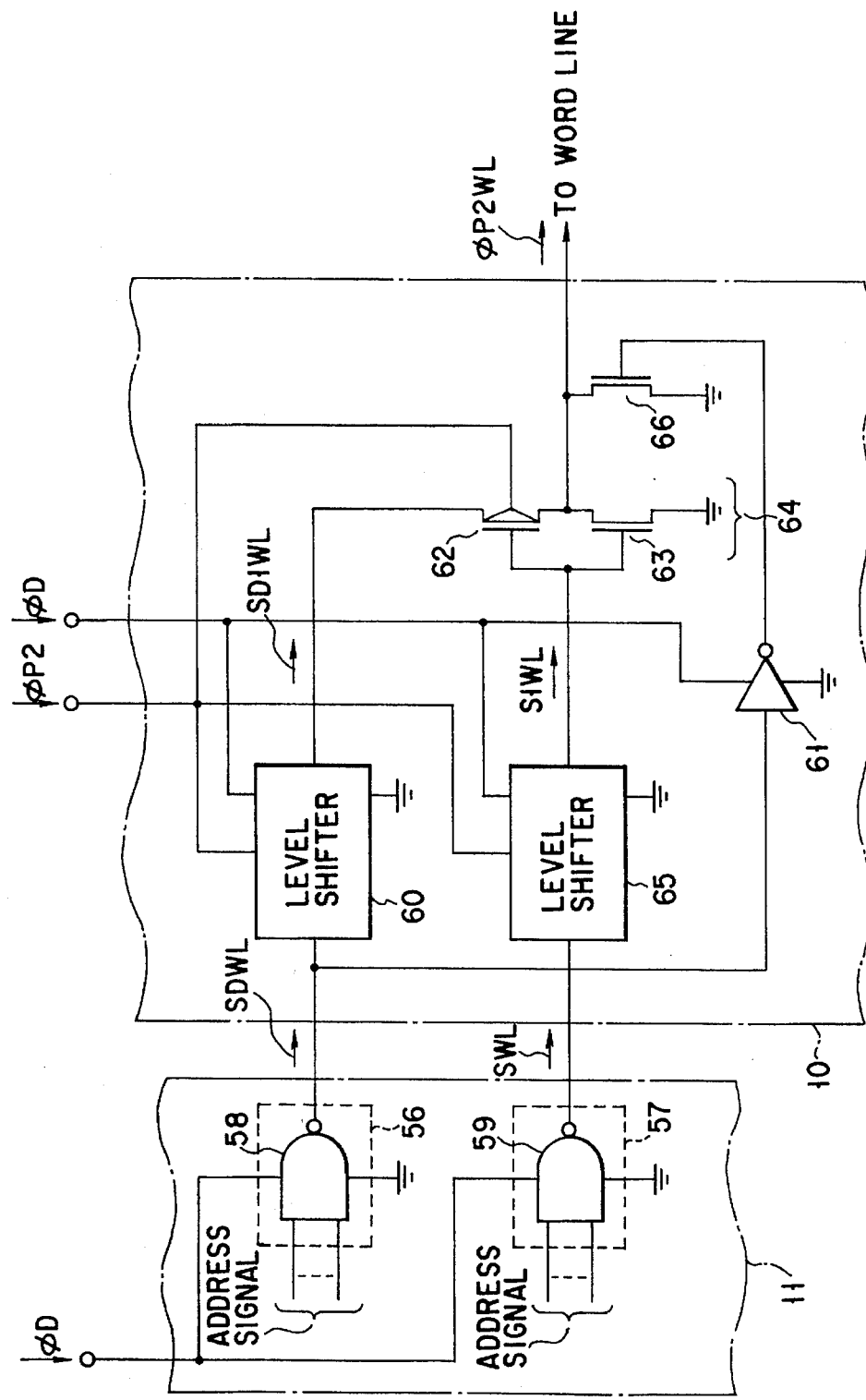
FIG. 14 is a circuit diagram showing a word line drive circuit and a part of a peripheral circuit shown in FIG. 6.

FIG. 14 is a circuit diagram showing a part of a word line drive circuit 10 and a peripheral circuit 11. As an example of a peripheral circuit 11 for use in a dynamic type RAM, a word line driver selection circuit 56 and a row decoder circuit 57 are shown in FIG. 14. In addition, as an example of the word line drive circuit circuit 10, a word line driver circuit for driving one word line by a boosted potential φP2 is also shown in FIG. 14.

The word line driver selection circuit 56 consists of an NAND gate 58 which receives a plurality of address signals as an input and outputs a decode signal SDWL from combinations of those address signals. Likewise, the row decoder circuit 57 consists of an NAND gate 59 which receives a plurality of address signals as an input and outputs a decode signal SWL from combinations of those address signals. These NAND gates 58 and 59 are driven by a potential difference between a regulated potential φD and a grounded potential. The decode signal SDWL is inputted into a level shifter 60 and an inverter 61. The decode signal SCWL is level-shifted by the level shifter 60 to generate an amplify signal SD1WL having a maximum potential substantially equal to the boosted potential φP2.

When the word line driver selection circuit 56 outputs a decode signal SDWL of a level "H", an amplify signal SD1WL of a level "H" is supplied from the output of the level shifter 60 to the source of a PMOS 62. An operating power source is thereby supplied to a CMOS inverter 64 consisting of a PMOS 62 and an NMOS 63, so that the inverter 64 is activated. After this inverter is activated, a boosted potential φP2WL having a maximum potential substantially equal to the boosted potential φP2 is outputted to a word line not shown in the figure, depending on whether the decode signal SWL is at a level "H" or "L", and the word line is driven by the boosted potential.

If a driver MOSFET for driving the word line is of a P-channel type, the word line can be voltage-boosted when an externally applied power source voltage is low. This method therefore has attracted public attention in recent years. In this method, as a matter of course, the boosted potential φP2 supplied as a power source to the word line drive circuit should desirably be a potential which does not cause potential changes but is stable.

In addition, a decode signal SWL is level-shifted by the level shifter 65 to generate an amplify signal S1WL having a maximum potential substantially equal to a boosted potential φP2.

On the contrary, when the word line driver selection circuit 56 outputs a decode signal SDWL of a level "L", an amplify signal SD1WL of a level "L" is supplied from the output of the level shifter 60 to the source of the PMOS 62. The CMOS inverter 64 thereby loses an operating power source, and this inverter is deactivated. In this state, the inverter 61 outputs a signal of a level "H". This signal of the level "H" is inputted into the gate of the NMOS 66 whose drain is connected to the inverter 64 and whose source is grounded. Therefore, the NMOS 66 is turned on and fixes the output of the inverter 64 at a level "L" while the decode signal SDWL of a level "L" is outputted. This inverter 64 is driven by a potential difference between the regulated φD and the grounded potential.

FIG. 15 is a circuit diagram of the level shifter 60 or 65 shown in FIG. 14. The level shifters 60 and 65 have the same structure, and therefore, explanation will be made with reference to only one structure shown in FIG. 15. As shown in FIG. 15, a decode signal SDWL (or SWL) is supplied to the gate of an NMOS 67 whose source is grounded and to an input of an inverter 68. When a decode signal SDWL (or SWL) of a level "H" is supplied to the gate of the NMOS 67, this NMOS 67 is turned on and sets the gate of a PMOS 68 having a source connected to a boosted potential φP2, to a low potential. Therefore, the PMOS 68 is turned on and outputs an amplify signal SD1WL (or S1WL) having a maximum potential substantially equal to the boosted potential φP2.

Further, when a decode signal SDWL (or SWL) is supplied to the gate of an NMOS 67, this NMOS 67 is turned on. In this state, the inverter 68 outputs a signal of level "H". This signal of level "H" is supplied to the gate of an NMOS 69 whose source is grounded and whose drain is connected to the drain of a PMOS 68. Therefore, the NMOS 69 is turned on and fixes the output of the level shifter 60 (or 65) to the level "L" while the decode signal SDWL (or SWL) of level "L" is outputted. The inverter 68 is driven by a potential difference between the regulated potential φD and a grounded potential.

A dynamic type RAM as explained in the above first embodiment contains an important structure as will be described below.

FIG. 16 is a block diagram schematically showing a main part of a dynamic type RAM shown in FIG. 6. At first, internal boost circuits 5 and 7 are operated by using a regulated potential φD as their operating power source. In a method of using the regulated potential φD as an operating power source, operation of the boost circuits 5 and 7 is not much changed, since a constant potential range within which potential changes are small is obtained by restricting the regulated potential φD to a potential level. If an applied potential VCC changes within the constant potential range, the operating power source voltage of the boost circuits 5 and 7 does not change. Therefore, it is possible to ensure operating margins of the boost circuits 5 and 7.

In addition, a boosted potential φP is obtained by boosting the regulated potential φD. This prevents changes of the internal boosted potential φP due to changes in the external power source voltage, and, enables the semiconductor integrated circuit device to operate with an external power source voltage of a large range.

Figure 23:
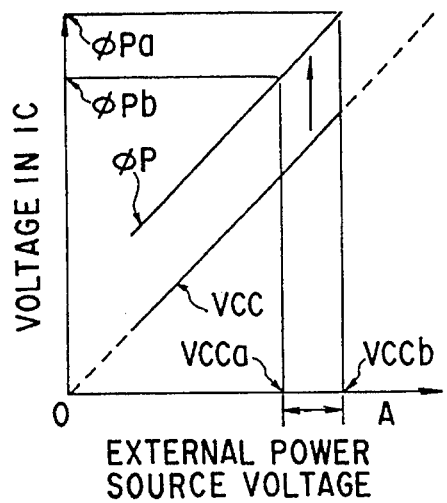
FIG. 23 is a graph showing the characteristic of an internal boosted voltage in a conventional device.

FIGS. 23 and 24 are graphs showing characteristics of the internal boosted voltages, and FIG. 23 shows the characteristic of an internal boosted voltage of a conventional device, while FIG. 24 shows the characteristic of an internal boosted voltage of a device according to the present invention. As shown in FIG. 23, in case of an internal boosted potential φP obtained by boosting an external power source potential VCC, the internal boosted potential φP changes within a range from φPa to φPb if the external power source potential changes within a range from VCCa to VCCb, as indicated by the reference A in the figure. In contrast, a range within which the power source voltage in the IC has a small change rate, i.e., a regulated potential φD having a constant potential range 100 is obtained by restricting the external power source potential VCC at a certain potential level, as shown in FIG. 24. Then, the regulated potential $\phi$D is boosted to obtain a boosted potential $\phi$P, with the constant potential range being reflected. The boosted potential thus obtained has a range (constant potential range) 101 where the change rate of the power source voltage is small. Therefore, even when an external power source potential changes from VCCa to VCCb, the boosted potential $\phi$P does not change as long as changes in the external power source potential fall within the range of the constant potential range. As a result, changes in the internal boosted potential $\phi$P due to changes in the external power source voltage can be prevented. Further, in this structure, the semiconductor integrated circuit device can operate with a power source voltage of a large range, i.e., the semiconductor integrated circuit device can always be operated in the same manner without erroneous operation, regardless of whether the device is supplied with a voltage of 5 V or 3 V.

In addition, if the output potential of the voltage regulator 6 is used as the power source for the boost circuits 5 and 7, the boosted potential $\phi$P can be set to a value equal to or lower than the external power source voltage VCC, so that the operation of the boost circuits 5 and 7 can be ensured when the external 10 power source voltage VCC is high.

In a conventional device, a range in which a boosted potential $\phi$P in the IC has a small change rate can be obtained by controlling a boost circuit which generates a boosted potential $\phi$P with use of a voltage control circuit. However, since the boosted potential $\phi$P is a potential generated by the boost circuit, the boost potential cannot be set to a value lower than the potential VCC which serves as a power source for the boost circuit, and therefore, the range in which the boosted potential $\phi$P has a small change rate can be set within only a limited range. Further, there is a problem that the power source for the boost circuit changes due to changes in the potential VCC, thereby changing the oscillation frequency of the boost circuit and the current supply ability.

In a device according to the first embodiment, the boost potential $\phi$P1 for generating a regulated potential $\phi$D for driving the peripheral circuit and the boosted potential $\phi$P2 used for driving a word line can be controlled independently from each other.

The boosted potential $\phi$P1 for generating the regulated potential $\phi$D should desirably be set to a potential in view of the operating speed, the current consumption, and a timing margin, and the boosted potential $\phi$P2 for driving a word line should desirably be set to a potential in view of the charge maintaining characteristic of a memory cell, the transfer transistor characteristic, the charge/discharge current, and the reliability. Therefore, the characteristic of the entire DRAM can be improved by optimizing the boosted potentials $\phi$P1 and $\phi$P2 independently from each other.

Further, it is effective to use boost circuits independent from each other in view of AC-operation, in addition to advantages of freely setting potentials for DC-operation, for the following reasons. The boosted potential $\phi$P2 supplied to the word line drive circuit 10 changes in accordance with elapsed time, due to charging/discharging accompanied by operation of the word line circuit. If the boosted potential $\phi$P2 is connected to a gate of a MOSFET which serves as a driver for a source follower type voltage regulator, the regulating potential supplied to the peripheral circuit 11 changes in accordance with operation of the word line drive circuit, thereby causing a decrease in operating margins.

The structure shown in FIG. 16 has remarkable advantages in consideration of the above reasons. As shown in FIG. 16, a boost circuit 5 for supplying a potential for a gate of a driver MOSFET of a source follower type voltage regulator 6 is separately provided in addition to a boost circuit 7 provided for driving a word line drive circuit 10. Specifically, in a device according to the first embodiment, two voltage supply systems are provided for supplying boosted potentials. If two voltage supply systems are thus provided, the circuit configuration may be complicated which, however, will not lead to an increase in the size of a chip since the boost circuit 7 for supplying the source follower type voltage regulator 6 with a boosted potential $\phi$P1 requires only a small current. Therefore, the disadvantage of the complicated circuit configuration can be negligible, in view of the advantage that operation of the word line drive circuit 10 does not result in changes in the boosted potential $\phi$P1 for generating a regulated potential $\phi$D, by independently providing the boosted potential $\phi$P1 for generating a regulated potential $\phi$D and the boosted potential $\phi$P2 for driving a word line.

Further, use of a source follower type voltage regulator 6 is suitable for integration into an IC since this type of voltage regulator can be constructed with a simple structure and also can be easily divided and located into a plurality of local positions in the IC.

When a source follower type NMOS 45 is used as a source follower type voltage regulator 6 as shown in FIG. 12, it is desirable to supply a boosted potential $\phi$P1 for the gate of the NMOS 45.

Figure 25:
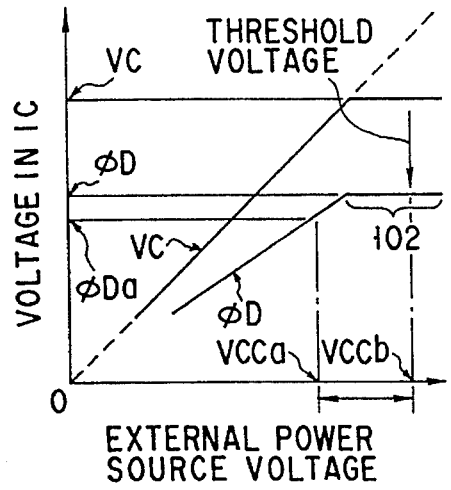
FIG. 25 is a graph showing the characteristic of an internal regulated voltage in a conventional device.

FIGS. 25 and 26 show characteristics of internal regulated voltages. FIG. 25 shows the characteristic of an internal regulated voltage according to a conventional device, while FIG. 26 shows the characteristic of an internal regulated voltage according to a device of the present invention. As shown in FIG. 25, if a limited potential VC obtained by limiting an externally applied voltage VCC to a certain potential is supplied to a gate of an NMOS 45 and a regulated potential $\phi$D is obtained from the limited potential VC, a constant potential range of the regulated potential $\phi$D is narrow. When a external power source exceeds the range of the constant potential range 102 and reaches to a VCCa, the regulated potential $\phi$D changes to a regulated potential $\phi$Da. In contrast, as shown in FIG. 26, if a regulated potential $\phi$D is obtained by supplying a boosted potential $\phi$P1 to the gate of the NMOS 45, the constant potential range 102 of the regulated potential $\phi$D can be enlarged so that operating margins are enhanced.

In addition, an ideal internal power source voltage will show a change rate equal to an external power source voltage VCC when the voltage VCC is low, and will show a smaller change rate than that of the voltage VCC when the external power source voltage VCC is high. Specifically, an ideal internal power source will have the same characteristic as the regulated potential $\phi$D shown in FIG. 26. To realize this characteristic, a boosted potential $\phi$P1 is supplied to the gate of an NMOS 45. Then, a regulated potential $\phi$D obtained by regulating the boosted potential $\phi$P1 by a threshold voltage is set to a value increased by the threshold voltage of the NMOS 45, so that the regulated potential $\phi$D has the characteristic shown in FIG. 26.

Next, a dynamic type RAM according to the second embodiment of the present invention will be explained.

Figure 17:
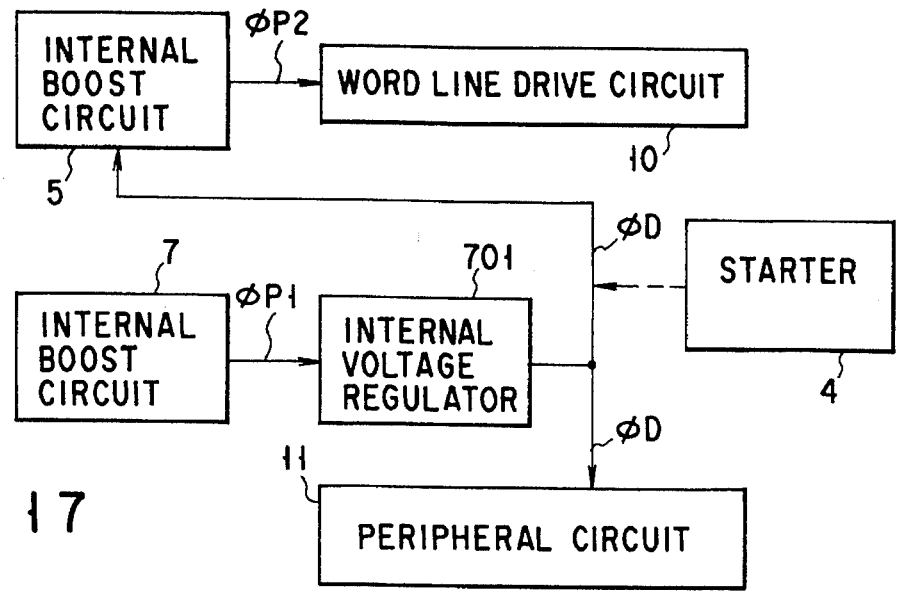
FIG. 17 is a block diagram schematically showing a main part of a dynamic type RAM according to the second embodiment of the present invention.

FIG. 17 is a block diagram schematically showing a main part of the dynamic type RAM according to the second embodiment of the present invention. In the device of the second embodiment, a boosted potential $\phi$P2 generated by a boost circuit 5 is used as a power source for a word line drive circuit 10 for driving the word line, and a regulated potential φD generated by a voltage regulator 701 is used as a power source for a peripheral circuit 11. In this device, the regulated potential φD generated by the voltage regulator 701 is used as a power source for the boost circuit 5.

In this structure, since the boost circuit 5 uses a regulated potential φD as a power source, it is possible to obtain the effect of enlarging operating margins as in the device according to the first embodiment, particularly, explained with reference to FIG. 24. As stated in the explanation to FIG. 24, an output of the boosted potential φP2 generated by the boost circuit 5 should preferably have a constant potential range like the characteristic of an internal regulated potential rather than an external power source voltage. Therefore, it is more suitable to use an output potential φD of the internal voltage regulator as a drive power source for the boost circuit 5, than to use directly an external power source voltage VCC.

Although in the device shown in FIG. 17, the boosted potential is divided into a boosted potential φP1 for generating a regulated potential and a boosted potential φP2 for driving an integrated circuit, as in the first embodiment, the boost circuit 7 for a voltage regulator need not always be driven by the regulated potential φD since the boost circuit 7 is used only to drive the voltage regulator 701. Further, the voltage regulator 701 is not limited to a source follower type, but may be a circuit which limits an external power source potential VCC to a certain potential level.

Next, a dynamic type RAM according to the third embodiment of the present invention will be explained.

Figure 18:
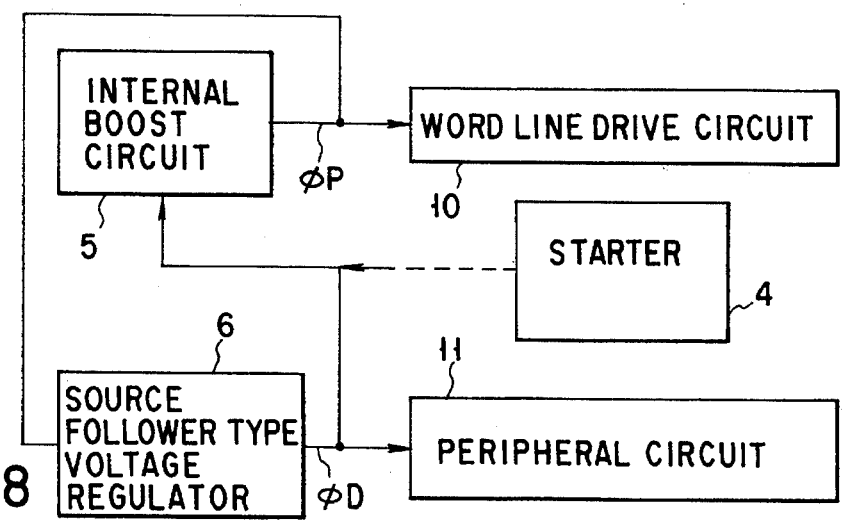
FIG. 18 is a block diagram schematically showing a main part of a dynamic type RAM according to the third embodiment of the present invention.

FIG. 18 is a block diagram schematically showing a main part of a dynamic type RAM according to the third embodiment of the present invention. Two power source supply systems must not always be used for supplying a boosted potential φP. In this structure, since a boost circuit 5 is driven by using a regulated potential φD as a power source, it is possible to obtain the effect of enlarging operating margins as in the device according to the first embodiment, particularly, explained with reference to FIG. 24.

Next, a dynamic type RAM according to a fourth embodiment of the present invention will be explained.

Figure 19:
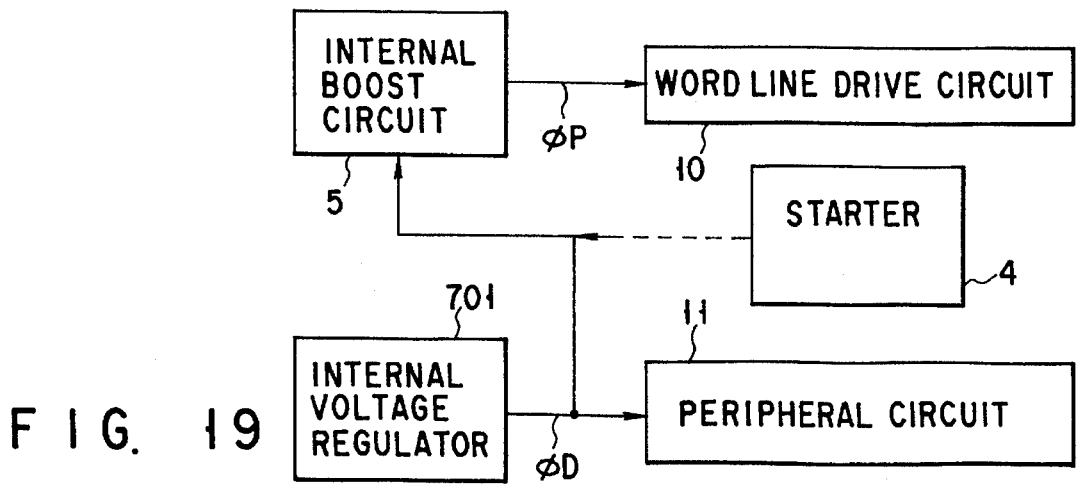
FIG. 19 is a block diagram schematically showing a main part of a dynamic type RAM according to the fourth embodiment of the present invention.

FIG. 19 is a block diagram schematically showing a main part of a dynamic type RAM according to the fourth embodiment of the present invention. Two power source supply systems must not be provided for supplying a boosted potential φP, or a voltage regulator need not be of a source follower type. In this structure, since a boost circuit 5 is driven by using a regulated potential φD as a power source, it is possible to obtain the effect of enlarging operating margins as in the device according to the first embodiment.

The present invention is not limited to the above first to fourth embodiment, but may be variously modified.

Figure 20:
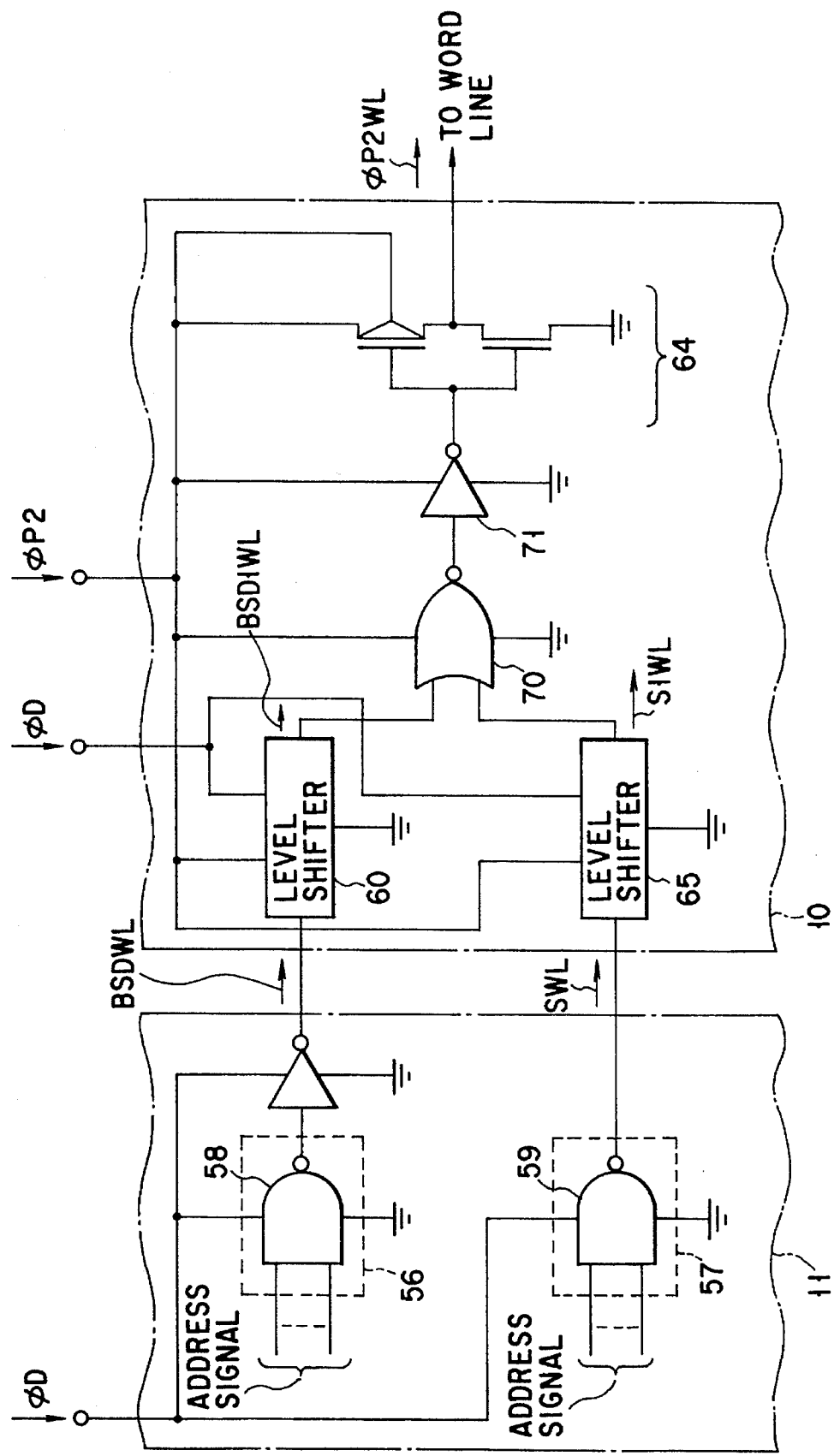
FIG. 20 is a first circuit diagram showing another example of the word line drive circuit.

FIG. 20 is a first circuit diagram showing another example of a word line driving circuit. The word line driving circuit shown in FIG. 20 differs from that shown in FIG. 14 in the following points. That is, in the circuit shown in FIG. 14, a decode signal SDWL outputted from the word line driver selection circuit 56 is level-shifted by a level shifter 60 to obtain a voltage signal SD1WL. An inverter 63 having an output connected to a word line is driven by the voltage signal SD1WL thus level-shifted, so that an output φP2WL is outputted. In contrast, the circuit shown in FIG. 20 is provided with a NOR gate 70 which receives, as an input, a level-shifted decode signal BSD1WL (i.e., an inverse signal of the decode signal SDWL) supplied from a word line driver selection circuit 56. The NOR gate 70 outputs a signal of a level "H" when the decode signals BSD1WL and BS1WL are both at a level "L". The signal of the level "H" is converted by the inverter 71 so as to have a level "L". The signal of this level "L" is inputted into the inverter 64, and an output signal φ2WL is inverted so as to have a level "H". Thus, the signals may be transformed.

Although it has not yet been clearly described in the above embodiment, the peripheral circuit 11 includes a circuit driven by an output of the boost circuit φP2 for driving the word line, for example, like the peripheral circuits 11 shown in FIGS. 21 and 22. In addition, there may a circuit in which a signal having an amplitude of a voltage φP2 is inputted by a level shift circuit as shown in FIG. 15, into a NAND gate for decoding, e.g., a gate of PMOS constituting an NAND equivalent to the NAND 58 and 59 shown in FIGS. 14 and 20, while a signal having an amplitude of a voltage φD is inputted into the gate of an NMOS. Further, the peripheral circuit 11 includes a circuit driven by an external power source voltage VCC, which is not particularly shown in the figure.

There may be a case in which a part of a boost circuit is driven by an external power source voltage. For example, supposing that the structure shown in FIG. 17 is used, a boost circuit 7 for a voltage regulator may be driven by an external power source voltage VCC.

In addition, the same feed back type voltage regulator as the starter circuit 4 shown in FIG. 13 may be used in place of the voltage regulator 6 shown in FIG. 6. If a feed back type voltage regulator is thus used, it is not necessary to use a boost circuit for a voltage regulator.

A starter 4 need be added only in case of using the structure requiring a starter 4 as in the device according to the first embodiment. Further, the starter 4 is basically constituted as a voltage regulator.

Although a dynamic type RAM having a relatively simple structure has been described as an example of the device according to the first embodiment, the present invention may be adopted to a dynamic type RAM having another structure. For example, the present invention may be adopted to a dynamic type RAM provided with different boost circuits for a stand-by (or waiting) state and for an active (or operating) state.

Further, the present invention may be adopted not only to a dynamic type RAM, but also to a semiconductor memory device other than a DRAM, e.g., to an EEPROM provided with both of an internal regulated potential generation circuit and an internal boosted potential generation circuit. The present invention may also be adopted to a micro-processor including a memory.

Also, the present invention may be adopted not only to memory devices but to a logic LSI, since the embodiments of this invention attain effects which will be explained below.

Figure 27:
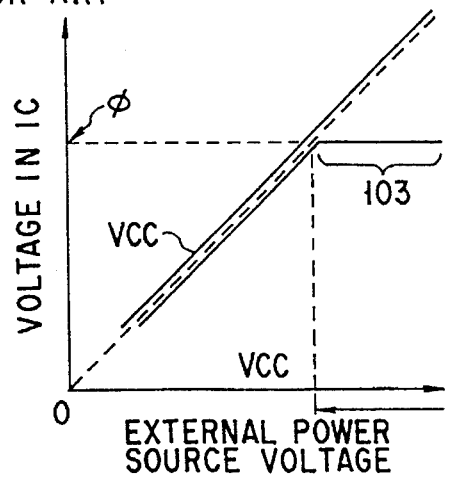
FIG. 27 is a graph showing the characteristic of an internal power source voltage in a conventional device.

FIGS. 27 and 28 are graphs showing characteristics of the internal power source voltages, and FIG. 27 shows the characteristic of an internal power source voltage of a conventional device, while FIG. 28 shows the characteristic of an internal power source voltage of a device according to the present invention. If the potential of an external power source potential VCC is limited thereby to set an internal power source voltage φ, a constant potential range 103 can be obtained as shown in FIG. 27. In contrast, if the potential of the external power source potential VCC is limited and the limited potential φL is boosted thereby to set an internal power source voltage φ, the constant potential range 103 can be enlarged. Thus, the present invention is effective to ensure operating margins for a semiconductor integrated circuit device.

Further, in the method shown in FIG. 27, the internal power source voltage φ can be set only to a voltage equal to or lower than the external power source voltage VCC. However, in the method shown in FIG. 28, the internal power source voltage φ can be set not only to a voltage equal to or less than the external power source voltage VCC, but also to a voltage higher than the voltage VCC, so that the internal power source voltage can thus be set to various voltages. Therefore, power source voltages can be respectively set in conformity with a plurality of circuit blocks provided in the semiconductor integrated circuit and the purposes thereof. In these structures, the internal power source voltage φ is not changed easily, even when the external power source voltage VCC changes.

As has been explained above, according to the present invention, it is possible to provide a power source voltage system effective for a semiconductor integrated circuit which uses a single external power source and comprises both a boost circuit and a voltage regulator inside the chip. Therefore, the present invention is advantageous to ensure operation with use of an external power source voltage VCC of a large range.

Also as has been explained above, according to the present invention, it is possible to provide a semiconductor integrated circuit device which is capable of restricting changes in the internal power source potentials even when an externally applied power source potential changes.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor integrated circuit device comprising:
   an integrated circuit section;
   converting means for converting a first potential, which causes changes in potential levels, into a second potential which has a substantially constant potential range in which potential changes are reduced by regulating the first potential to a predetermined potential level; and
   generating means driven by the second potential as a power source, for generating a third potential used as an operating power source for at least a part of circuits in the integrated circuit section.

2. A semiconductor integrated circuit device according to claim 1, wherein the converting means includes a voltage regulator for regulating the first potential to the predetermined potential level, and the generating means is a boost circuit driven by using the second potential as a power source for generating the third potential by boosting the second potential, with the substantially constant potential range of the second potential being reflected.

3. A semiconductor integrated circuit device according to claim 2, wherein the boost circuit includes a charge pump circuit.

4. A semiconductor integrated circuit device according to claim 3, wherein the second potential is used as a power source for the boost circuit and as an operating power source for a part of the integrated circuit section.

5. A semiconductor integrated circuit device according to claim 1, wherein the integrated circuit section is a dynamic type RAM including a peripheral circuit and a word line drive circuit, said peripheral circuit using the second potential as a power source and said word line drive circuit using the third potential as a power source.

6. A semiconductor integrated circuit device according to claim 5, wherein the converting means includes a starter circuit and a voltage regulator for regulating the first potential to a predetermined potential level, the generating means generating the third potential from the predetermined potential level outputted by the starter circuit, the third potential serving as a drive signal for the voltage regulator, the voltage regulator supplying a potential level equal to the predetermined potential level to the starter circuit, and the starter circuit being rendered non-conductive when the voltage regulator starts operating.

7. A semiconductor integrated circuit device according to claim 6, further comprising:
   a power-on reset circuit for controlling the starter circuit to be turned ON/OFF; and
   a reference voltage generating circuit for controlling the predetermined potential level outputted from the starter circuit.

8. A semiconductor integrated circuit device comprising:
   an integrated circuit section;
   first converting means for converting a first potential which causes changes in potential levels into a second potential which has a substantially constant potential range in which potential changes are reduced by regulating the first potential to a predetermined potential level;
   generating means driven by the second potential as a power source, for generating a third potential which is higher than the second potential and is used as an operating power source for at least a part of a first circuit block in the integrated circuit section; and
   second converting means using the third potential, for generating a fourth potential which is lower than the third potential and is used as an operating power source for at least a part of a second circuit block in the integrated circuit section.

9. A semiconductor integrated circuit device according to claim 8, wherein the first converting means includes a starter circuit for driving the generating means, the generating means being driven by the fourth potential as a power source in place of the second potential after the second converting means generates the fourth potential.

10. A semiconductor integrated circuit device according to claim 8, wherein the generating means includes a boost circuit driven by the second potential as a power source for generating the third potential by boosting the second potential with the substantially constant potential range of the second potential being reflected, and the second converting means is a source follower type voltage regulator including an insulating gate type FET which has a drain applied with the first potential and a source for outputting the fourth potential, said insulating gate type FET having a gate applied with the third potential.

11. A semiconductor integrated circuit device according to claim 10, wherein the third potential is set to a potential higher than the fourth potential by a difference equivalent to or greater than a threshold value of the insulating gate type FET.

12. A semiconductor integrated circuit device according to claim 8, wherein the integrated circuit section is a dynamic type RAM including a peripheral circuit and a word line drive circuit, said peripheral circuit using the fourth potential as a power source and said word line drive circuit using the third potential as a power source.

13. A semiconductor integrated circuit device according to claim 12, wherein the first converting means includes a starter circuit for starting the generating means, and the second converting means is a voltage regulator which includes an insulating gate type FET of a source follower type having a drain applied with the first potential and a source for outputting the fourth potential and which converts the first potential to the fourth potential having a substantially constant potential range in which potential changes are reduced, the generating means generating the third potential from the predetermined potential level outputted by the starter circuit, the third potential serving as a drive signal for the voltage regulator, the voltage regulator supplying a potential level equal to the predetermined potential level to the first converting means, and the starter circuit being rendered non-conductive when the voltage regulator starts operating.

14. A semiconductor integrated circuit device according to claim 13, further comprising:

a power-on reset circuit for controlling the starter circuit to be turned ON/OFF; and a reference voltage generating circuit for controlling the predetermined potential level outputted from the starter circuit.

15. A semiconductor integrated circuit device comprising:

an integrated circuit section;

first converting means for converting a first potential which causes changes in potential levels into a second potential which has a substantially constant potential range in which potential changes are reduced by regulating the first potential to a predetermined potential level;

first generating means driven by the second potential as a power source, for generating a third potential which is higher than the second potential;

second converting means for regulating the first potential by using the third potential as a control signal, and for generating a fourth potential which is used as an operating power source for at least a part of a first circuit block in the integrated circuit section; and second generating means using the second potential for generating a fifth potential used as an operating power source for at least a second circuit block in the integrated circuit section.

16. A semiconductor integrated circuit device according to claim 15, wherein the integrated circuit section is a dynamic type RAM including a peripheral circuit and a word line drive circuit, said peripheral circuit using the fourth potential as a power source and said word line drive circuit using the fifth potential as a power source.

17. A semiconductor integrated circuit device according to claim 16, wherein the first converting means includes a starter circuit for starting the first generating means, the second converting means including an insulating gate type FET of a source follower type having a drain applied with the first potential and a source for outputting the fourth potential and the second converting means being a voltage regulator which regulates the first potential while maintaining a substantially constant potential range in which potential changes are reduced, the first generating means generating the third potential from the predetermined potential level outputted by the starter circuit, the third potential serving as a control signal for the voltage regulator, the voltage regulator supplying a potential level equal to the predetermined potential level to the first converting means and the second generating means, and the starter circuit being rendered non-conductive when the voltage regulator starts operating.

18. A semiconductor integrated circuit device according to claim 17, wherein the third potential is set to a potential higher than the fourth potential by a difference equivalent to or greater than a threshold value of the insulating gate type FET.

19. A semiconductor integrated circuit device according to claim 17, wherein the first generating means is a boost circuit which is driven by the second potential as a power source and obtains the third potential by boosting the second potential with the substantially constant potential range of the second potential being reflected.

20. A semiconductor integrated circuit device according to claim 17, further comprising:

a power-on reset circuit for controlling the starter circuit to be turned ON/OFF; and a reference voltage generating circuit for controlling the predetermined potential level outputted from the starter circuit.

21. A semiconductor integrated circuit device comprising:

an integrated circuit section;

first generating means, having a constant potential range in which a potential variation is smaller than a potential variation of a first potential, for generating a second potential which is higher than the first potential;

a first circuit block in which the second potential is used as an operating power source;

second generating means, having a constant potential range in which a potential variation is smaller than the first potential, for generating a third potential which is higher than the first potential;

third generating means for generating a fourth potential, lower than the first potential, by using the third potential; and a second circuit block in which the fourth potential is used as an operating power source, wherein the third generating means is a source follower type voltage regulator circuit including an insulated gate FET, the insulated gate FET having a drain to which the first potential is applied, a source from which the fourth potential is output, and a gate to which the third potential is applied.

22. A semiconductor device according to claim 21, wherein the integrated circuit section is a dynamic RAM, the first circuit block being a word line-driving system circuit having a circuit in which the second potential is used as a power source and the second circuit block being a dynamic RAM peripheral circuit having a circuit in which the fourth potential is used as a power source.

23. A semiconductor integrated circuit device comprising:

an integrated circuit section;

first converting means for converting a first potential which causes changes in potential levels into a second potential which has a substantially constant potential range in which potential changes are reduced by regulating the first potential to a predetermined potential level;

generating means driven by the second potential as a power source, for generating third and fourth potentials which are higher than the second potential, the third potential being used as an operating power source for at least a part of a first circuit block in the integrated circuit section; and second converting means using the fourth potential, for generating a fifth potential which is lower than the fourth potential, the fifth potential being used as an operating power source for at least a part of a second circuit block in the integrated circuit section.

24. A semiconductor integrated circuit device according to claim 23, wherein the first converting means includes a starter circuit for driving the generating means, the generating means being driven by the fifth potential as a power source in place of the second potential after the second converting means generates the fifth potential.

25. A semiconductor integrated circuit device according to claim 23, wherein the generating means includes a boost circuit driven by the second potential as a power source for generating the fourth potential by boosting the second potential with the substantially constant potential range of the .second potential being reflected, and the second converting means is a source follower type voltage regulator including an insulating gate type FET which has a drain applied with the first potential and a source for outputting the fifth potential, said insulating gate type FET having a gate applied with the fourth potential.

26. A semiconductor integrated circuit device according to claim 25, wherein the fourth potential is set to a potential higher than the fifth potential by a difference equivalent to or greater than a threshold value of the insulating gate type FET.

27. A semiconductor integrated circuit device according to claim 23, wherein the integrated circuit section is a dynamic type RAM including a peripheral circuit and a word line drive circuit, said peripheral circuit using the fifth potential as a power source and said word line drive circuit using the third potential as a power source.

28. A semiconductor integrated circuit device according to claim 27, wherein the first converting means includes a starter circuit for starting the generating means, and the second converting means is a voltage regulator which includes an insulating gate type FET of a source follower type having a drain applied with the first potential and a source for outputting the fifth potential and which converts the first potential to the fifth potential having a substantially constant potential range in which potential changes are reduced, the generating means generating the fourth potential from the predetermined potential level outputted by the starter circuit, the fourth potential serving as a drive signal for the voltage regulator, the voltage regulator supplying a potential level equal to the predetermined potential level to the first converting means, and the starter circuit being rendered non-conductive when the voltage regulator starts operating.

* * * * *